United States Patent [19]
Crumly et al.

[11] 3,942,109
[45] Mar. 2, 1976

[54] SWEEPING SPECTRUM ANALYZER

[75] Inventors: Charles B. Crumly, Palo Alto; John P. Lindley, Redwood City, both of Calif.

[73] Assignee: Itek Corporation, Lexington, Mass.

[22] Filed: Jan. 10, 1975

[21] Appl. No.: 540,183

[52] U.S. Cl. ............................................. 324/77 K
[51] Int. Cl.² ........................................ G01R 23/16
[58] Field of Search ......................... 324/77 R, 77 K

[56] References Cited
UNITED STATES PATENTS

| | | | |
|---|---|---|---|
| 2,943,315 | 6/1960 | Rosenthal | 324/77 K |
| 3,055,258 | 9/1962 | Hurvitz | 324/77 K |
| 3,220,003 | 11/1965 | Montague | 324/77 K |
| 3,365,579 | 1/1968 | Emshwiller | 324/77 K |

*Primary Examiner*—R. V. Rolinec
*Assistant Examiner*—Michael J. Tokar
*Attorney, Agent, or Firm*—Homer O. Blair; Robert L. Nathans; Gerald H. Glanzman

[57] ABSTRACT

A sweeping spectrum analyzer for analyzing the frequency and amplitude of an input signal is comprised of a Bragg cell with a laser beam input and an accoustic signal input. An input signal is mixed with a sweep signal to produce a heterodyned signal within the acoustic bandwidth of the Bragg cell. The heterodyned signal is applied to the Bragg cell and results in deflection of a laser beam passing therethrough. The Bragg cell output is imaged onto a charge coupled photodetector array and fed to a shift register as clock pulses. The clock pulses are synchronized with the sweep signal frequency for transfer as one charge packet down a charge coupled array.

8 Claims, 6 Drawing Figures

SYSTEM SCHEMATIC

SWEEPING SPECTRUM ANALYZER

BACKGROUND OF THE INVENTION

The present invention relates generally to a system for analyzing the frequency components of an input signal, and more particularly relates to a new and improved sweeping spectrum analyzer which utilizes optical techniques for processing electrical signals. Recent advances in optical technology have made optical processing of electrical signals far simpler and less expensive for certain frequency analyzer applications than conventional electronic processing.

More particularly, the spectrum analyzer of the present invention utilizes a Bragg cell in combination with a charge coupled photodetector array to achieve both high resolution and high sensitivity. A Bragg cell is usually a block of glass or crystalline material approximately 1 cm. × 1 cm. in cross section and up to 10 to 20 centimeters long. A piezoelectric transducer is bonded to the end of the cell and turned to the frequency band of interest. When the transducer is excited with an electrical signal, a travelling acoustic wave is set up in the cell. This causes slight changes in the refractive index of the cell between the peaks and valleys of the acoustic pressure wave. When light is introduced at the correct angle, termed the Bragg angle, the refractions from the index changes add in phase, and Bragg diffraction takes place. A portion of the input light beam is deflected, and can be imaged onto a screen or photodetector. The amplitude of the deflected beam is proportional to the amplitude of the acoustic input and the deflection angle is proportional to the frequency of the acoustic input. If a radio electric signal is fed into the Bragg cell, a spot of light is imaged the position of which is proportional to the signal frequency and the amplitude of which is proportional to the instantaneous signal strength. Thus, all of the modulation on the signal is preserved. If there are simultaneous multiple input signals at different frequencies within the Bragg cell bandwidth, they will be simultaneously imaged at different positions in the Bragg cell output. This is one of the key advantages of Bragg cell signal processing. Multiple signals can be processed simultaneously without the necessity for time sharing or sweeping. Another advantage is that the output is in a form suitable for further signal processing with recently developed complex detector arrays.

With Bragg cells a wide variety of operating parameters can be achieved. The efficiency of deflection is very high, and most applications require less than a watt of drive power. When there is no input there is no deflection and hence there is no output. Thus, the extinction ratio is essentially infinite.

SUMMARY OF THE INVENTION

In accordance with a preferred embodiment, a sweeping spectrum analyzer is disclosed which has high resolution, high sensitivity, and an improved time-bandwidth product. The preferred embodiment utilizes a Bragg cell for deflecting a light beam travelling through the cell in accordance with an acoustical signal applied to the cell. In a Bragg cell the amplitude of the deflected light beam is proportional to the amplitude of the acoustical signal, and the angle of deflection of the deflected light beam is proportional to the frequency of the acoustical signal. A variable frequency sweep signal is mixed with the input signal to be analyzed to produce a heterodyned signal which contains the frequency and amplitude information of the input signal and which also is swept in frequency by the sweep signal. The heterodyned signal is introduced to the Bragg cell as the acoustical signal to produce an output light beam from the Bragg cell which contains the frequency and amplitude information of the input signal and which also is swept in direction by the sweep signal. The output of the Bragg cell is detected by a charge coupled photodetector array. The charges within the charge coupled photodetector array are transferred in synchronism within the frequency of the sweep signal so that energy associated with a constant frequency component of the input signal will be transferred and collected as one charge packet as it is transferred down the charge coupled photodetector array.

Since all frequencies in the Bragg cell array are processed simultaneously, and since the photodetector array integrates the light falling upon it, there is little danger of missing a short duration signal. This can be of great advantage in jammer frequency control in which it is desired to measure signal frequencies accurately, especially when there is the possibility of a great number of simultaneous signals in the band. The system processes continuous-wave and pulsed signals esqually well, and can measure frequency accurately even when there are simultaneous multiple continuous wave signals and multiple pulses.

DESCRIPTION OF THE PREFERRED EMBODIMENT

Figure 1:
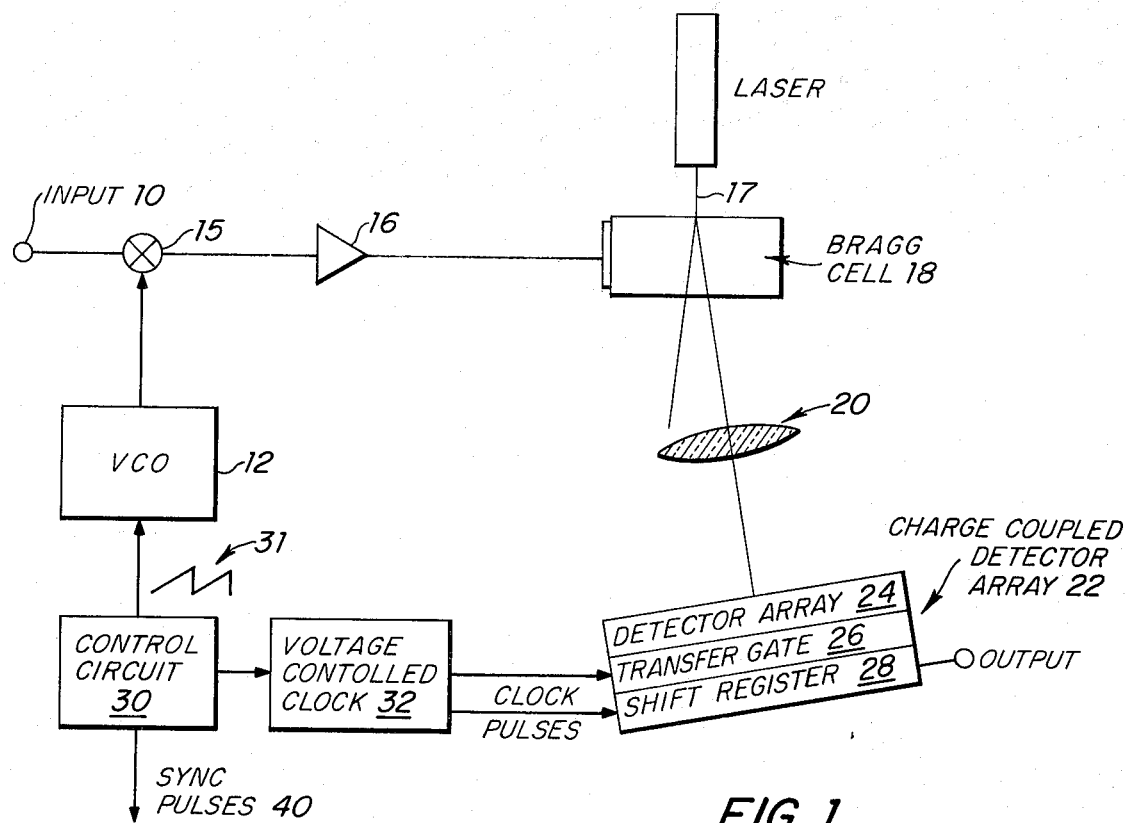
FIG. 1 illustrates the principle of operation of the present invention.

Referring to FIG. 1, there is illustrated the basic principle of operation of this invention. The invention analyzes an input signal received on input 10 for its frequency components and also for the strength or amplitude of each component. A voltage controlled oscillator 12 (In an alternative embodiment, a discrete stepping frequency source, such as a frequency synthesizer, may be substituted for the continuously swept voltage controlled oscillator) produces a signal the frequency of which is periodically swept upward, and directs it to a mixer 15 where it is mixed with the input signal 10 to obtain a heterodyned signal. The heterodyned signal contains the frequency and amplitude information of the input signal received on input 10, and also is swept in frequency by the oscillator 12.

The heterodyned signal has an intermediate frequency (IF) which is the difference between the frequency of the input signal and the frequency of the signal produced by local oscillator (LO) 12:

$$f_{IF} = f_{signal} - f_{LO}$$

or $$f_{IF} = f_{LO} - f_{signal}.$$

Figure 2:
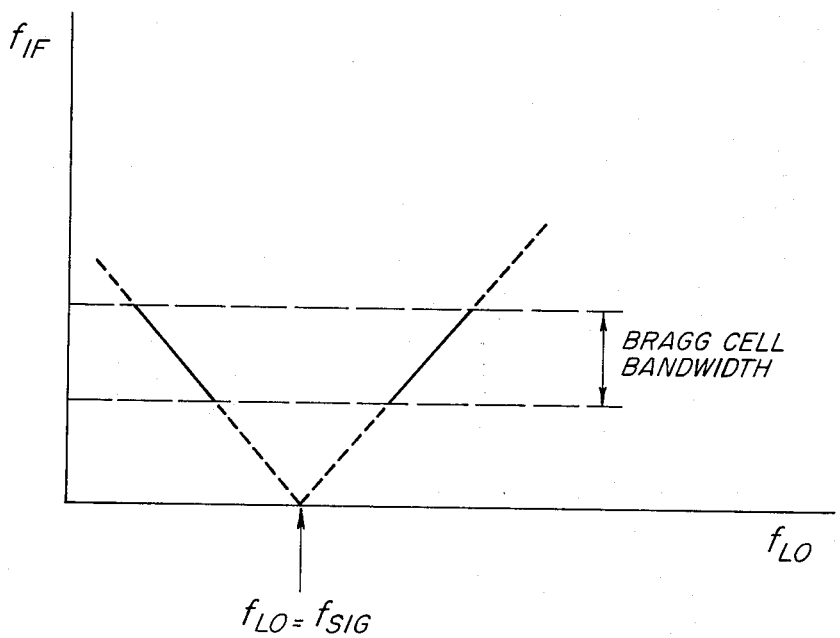
FIG. 2 is a graph of signals within the system which is useful in explaining the operation of the system.

Since the local oscillator is being swept in frequency, the IF frequency for a fixed frequency input signal will also be swept as shown in FIG. 2. If the local oscillator is swept in an upward direction, the frequency of the intermediate frequency signal will proceed first downward as the frequency of the local oscillator approaches the frequency of the input signal, and then will proceed upward when the local oscillator frequency surpasses the frequency of the input signal.

Referring back to FIG. 1, the heterodyned signal is amplified by an amplifier 16 and applied as the acoustical input signal to a Bragg cell 18 to deflect a laser beam 17 travelling therethrough. The deflected beam will contain the frequency and amplitude information of the input signal, and also will be swept across the output of the Bragg cell at a speed related to the sweep frequency of the sweep signal. Because the IF signal first decreases and then increases in frequency, the optical output of the Bragg cell for a fixed frequency input signal will be a spot of light moving across the Bragg cell output first in one direction and then in the other direction.

The output of the Bragg cell is imaged by an optical system 20 onto a charge coupled photodetector array 22. The charge coupled photodetector array includes a photodiode linear array 24, a semiconductor transfer gate 26 and an analog shift register 28 which functions to transfer charges down the array in accordance with clock pulses applied to the shift register. The frequency of the clock pulses is synchronized with the rate of sweep of the frequency of the sweep signal so that the energy associated with a constant frequency input signal is transferred and collected as one charge packet as it moves down the charge coupled array. In further explanation of this synchronization, if the VCO sweep is linear, the clock rate is set at a fixed rate which matches the frequency sweep of the VCO. If the VCO sweep is not linear or if the rate of frequency sweep is changed then the clock rate has to be changed accordingly.

The spot of light moving down the photodetector array in the direction in which charges are transferred by the shift register is utilized to analyze frequency components of the input signal. The spot of light moving in the opposite direction will not be collected as a single charge packet, but will be spread over a number of resolution elements in the array. Accordingly, there will be an inherent rejection of the spot of light moving in the opposite direction, and image band signals are strongly attenuated, such that conventional image filters may not be required.

The circuit operates as follows to transfer charges down the charge coupled photodetector array 22 at the same rate at which a spot of light caused by a fixed frequency signal moves across the array. A control circuit 30 supplies a sawtooth voltage 31 to oscillator 12 to sweep the frequency of that oscillator. Control circuit 30 also directs a fixed voltage to a voltage controlled clock 32 to control the frequency of the generated clock pulses. The clock pulses from clock 32 are applied to a charge coupled analog shift register 28 to increment it in synchronism with the frequency of the local oscillator 12 such that a spot of light associated with a fixed frequency input signal will be collected as one charge packet as it is transferred down the shift register 28. The overall output of the charge coupled array is a series of pulses with the amplitude and position of each pulse being proportional respectively to the integrated energy and frequency of the detected signal causing that pulse.

Figure 3:
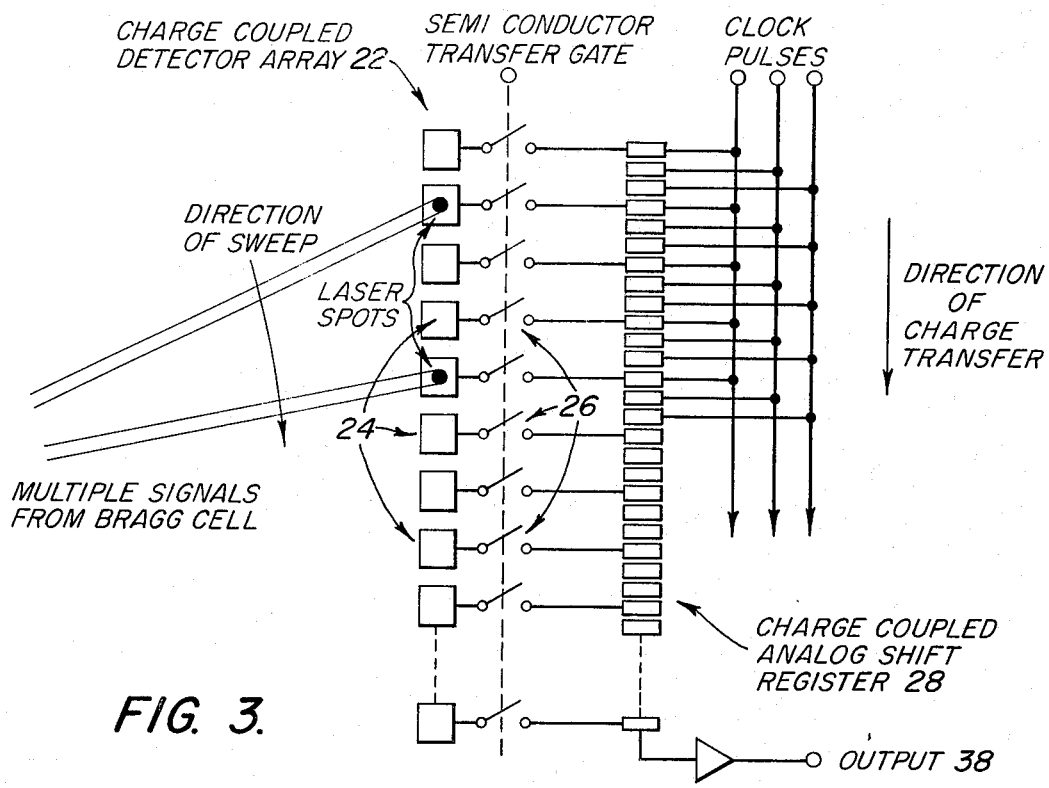
FIG. 3 shows a simplified schematic of a charge coupled photodetector array.

A simplified schematic of a charge coupled photodetector array 22 is illustrated in FIG. 3. The array of diode photodetectors 30 are connected to the charge coupled analog shift register 28 by the semiconductor transfer gate 26 which is illustrated for purposes of explanation as an array of switches. All of the gates are closed simultaneously when a proper voltage is applied thereto by clock 32. If light is incident on the photodetector diodes 24, a charge proportional to the intensity of the incident light is accumulated within the diodes, and this charge is transferred to the shift register 28 when the gates 26 are closed. By applying clock pulses at a frequency synchronized with the velocity of a spot of light moving down the array, a charge packet associated with that spot of light is moved down the array to the output 38 to produce an electrical output signal.

The shift register is incremented so that the charge on a photodiode caused by a light spot is transferred by semiconductor gate 26 to an element within the shift register just after the light spot has moved past that photodiode. The charge is then transferred to the element adjacent to it in the shift register associated with the adjacent photodiode. As the light spot travels across and is moving past that adjacent photodiode, the gates are closed again and the charge is the adjacent photodiode is added to that already stored in the shift register, and etc. Thus, all of the energy from one signal will be collected as one charge packet as it is transferred down the shift register.

In practice, the photodetector array, the semiconductor gates, the analog shift register and the associated circuitry to access the photodetectors are all produced on a single semiconductor chip. Such a semiconductor chip is currently available from Fairchild Semiconductor. A currently available charge coupled photodetector array (Fairchild CCD101) with 500 detector elements is reported to have a maximum gate closing rate of 100,000 Hz. If this is coupled to a Bragg cell of 500 MHz bandwidth with 1 MHz resolution, a sweeping spectrum analyzer may be constructed with the following characteristics. The optical system 20 would be designed so that the 500 MHz bandwidth is spread across the photodetector array, and each detector would resolve 1 MHz. Since the gate may be closed at a 100 kHz rate, the local oscillator may be swept through 1 MHz which allows 10 $\mu$sec for each of the 500 detectors or 5 msec for the total sweep.

The resulting system is equivalent to 500 single-channel receivers of the same resolution scanning at the same rate, yielding a corresponding improvement in the probability of intercepting low-duty-cycle pulse signals. Thus, the processing gain can be as high as 500 times.

Figure 4:
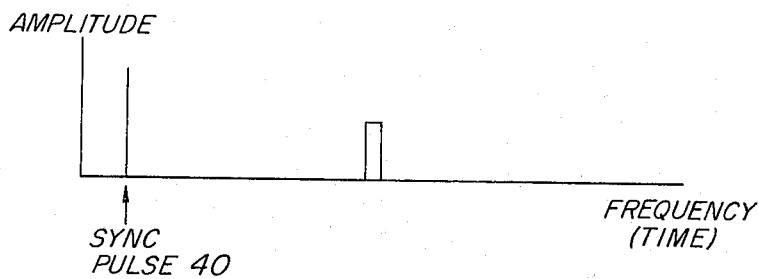
FIG. 4 (A, B, C) illustrates the output of the system for several different types of input signals.
Figure 4:
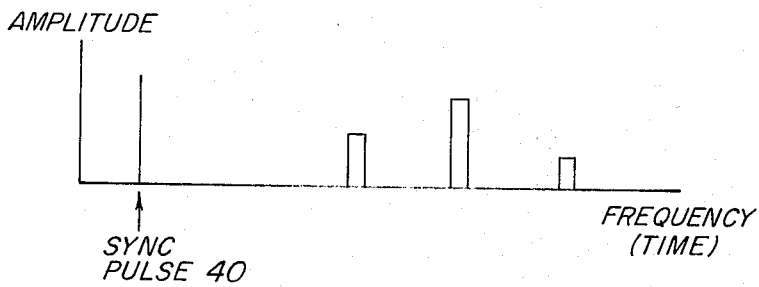
Figure 4:
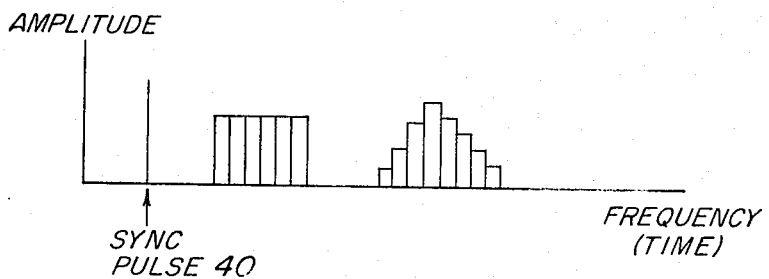

The overall output of the charge coupled array is a series of pulses with the amplitude and position of each pulse being proportional respectively to the integrated energy and frequency of the detected signal causing that pulse. FIG. 4 illustrates the output of the system for several different types of input signals. As shown, a sync pulse 40 is produced each time the oscillator 12 initiates a different sweep. The position of each output pulse relative to the sync pulse determines the frequency of the input signal causing that output pulse. If a single frequency signal is present on the input 10, the output from the charge coupled detector array 22 is a single pulse as shown in FIG. 4(A). If several different fixed frequency signals are present at the input 10, the output would be shown as in FIG. 4(B). The position of each of separate pulses relative to the sync pulse 40 determines the frequency of the input signals causing each of those pulses, and the amplitude of each output pulse determines the strength of each input signal. If a chirped signal or wide band signal is present at the input 10, the output would be as shown in FIG. 4(C). In each case, the amplitude would be proportional to the integrated RF power of each input signal, and the pulse position relative to the sync pulse determines the frequency of each input signal.

Although the preferred embodiment has been illustrated as a system for analyzing the frequency and amplitude of components of an input signal, it might be utilized to analyze just the frequency or just the amplitude components of an input signal. Also, the arrangement of the present invention might find utility in processing applications other than the specific processing application disclosed herein. For example, by modifying the clock rate relative to the sweep rate, it is possible to optimize the system to receive chirped signals, in effect bringing them "into focus," so that their energy is compressed into a large single pulse, while signals chirping at different rates are spread out and thereby de-emphasized. Further, the concept of moving charge packets in synchronism with a moving image could be applied to systems in which a moving image is present such as an aerial camera.

While several embodiments have been described, the teachings of this invention will suggest many other embodiments to those skilled in the art.

We claim:

1. A sweeping spectrum analyzer for analyzing the frequency components of an input signal, and having both high resolution and high sensitivity and comprising:
    a. a Bragg cell means for deflecting a light beam travelling through the cell in accordance with an acoustical signal applied to the cell with the amplitude of the deflected beam being proportional to the amplitude of the acoustical signal and the angle of deflection of the deflected beam being proportional to the frequency of the acoustical signal;
    b. means for producing a variable frequency sweep signal;
    c. means for mixing said variable frequency sweep signal with the input signal to be analyzed to produce a heterodyned signal which contains frequency and amplitude information of the input signal and which is also swept in frequency in accordance with the sweep frequency of said sweep signal;
    d. means for coupling said heterodyned signal to said Bragg cell as said acoustical signal, whereby the output signals of said Bragg cell will contain frequency and amplitude information of said input signal and will also be swept in frequency in accordance with the sweep frequency of said sweep signal;
    e. a charge coupled photodetector array means for detecting the output of said Bragg cell; and
    f. means for causing the charges within said charge coupled photodetector array means to be transferred in synchronism with the frequency of said sweep signal so that the energy associated with a constant frequency component of said input signal will be transferred and collected as one charge packet as it is transferred through said charge coupled photodetector array means.

2. A system as set forth in claim 1 and including optical means for imaging the output of said Bragg cell means onto said charge coupled photodetector array means.

3. A system as set forth in claim 1 wherein said means for producing a variable frequency sweep signal includes a voltage controlled swept frequency oscillator means for producing a variable frequency sweep signal.

4. A system as set forth in claim 1 wherein said means for causing the charges within said charge coupled array to be transferred in synchronism with the frequency of said sweep signal includes a voltage controlled clock means for supplying clock pulses to said charge coupled detector array means; and a control circuit means for controlling said swept frequency oscillator and said voltage controlled clock means.

5. A system as set forth in claim 1 wherein said charge coupled photodetector array means includes a single semiconductor chip means which comprises:
    a. a photodetector array;
    b. an analog shift register means for collecting and transferring charges received from said photodetector array; and
    c. a transfer gate means coupled between said photodetector array means and said analog shift register means for transferring charges from said photodetector array means to said analog shift register means.

6. A system as set forth in claim 5 and including optical means for imaging the output of said Bragg cell means onto said charge coupled photodetector array means.

7. A system as set forth in claim 6 wherein said means for producing a variable frequency sweep signal includes a voltage controlled swept frequency oscillator means for producing a variable frequency sweep signal.

8. A system as set forth in claim 7 wherein said means for causing the charges within said charge coupled array to be transferred in synchronism with the frequency of said sweep signal includes a voltage controlled clock means for supplying clock pulses to said charge coupled detector array means; and a control circuit means for controlling said swept frequency oscillator and said voltage controlled clock means.

* * * * *